United States Patent [19]

Gallagher

[11] 4,207,530

[45] Jun. 10, 1980

[54] ELECTRICALLY TUNABLE INDUCTOR AND METHOD

[75] Inventor: Lawrence W. Gallagher, Palatine, Ill.

[73] Assignee: Motorola, Inc., Schaumburg, Ill.

[21] Appl. No.: 832,483

[22] Filed: Sep. 12, 1977

[51] Int. Cl.² .......................... H04B 1/10; H04B 1/14
[52] U.S. Cl. .................................. 455/174; 336/155; 455/183; 455/194
[58] Field of Search ............... 325/173, 452, 453, 456, 325/468, 314, 454, 383, 393, 464; 334/11, 12, 14, 71; 336/155

[56] References Cited

U.S. PATENT DOCUMENTS

| | | | |
|---|---|---|---|
| 2,976,412 | 3/1961 | Colodny | 336/155 |
| 3,707,597 | 12/1972 | Lunn | 325/456 |
| 3,849,731 | 11/1974 | Morita et al. | 325/393 |

Primary Examiner—Robert L. Griffin
Assistant Examiner—Alexander Gerasimow
Attorney, Agent, or Firm—James W. Gillman; Donald J. Lisa; Phillip H. Melamed

[57] ABSTRACT

A radio receiver having a tunable RF stage with an electrically tunable inductor is disclosed. The tunable inductor consists of a magnetic device with a core whose degree of magnetic saturation is controlled by various control currents. A phase lock loop with a programmable frequency divider responds to inputs from a tuning control means and provides a local oscillator signal to a mixer in the radio receiver while also providing a control current to the magnetic device, defined herein as Current Controlled Inductor (C.C.I.), which is directly related to the frequency of the local oscillator signal supplied to the mixer. Each time the radio receiver is tuned to a different input frequency by changing the frequency of the local oscillator signal, a predetermined reference current is applied to the C.C.I. before a new control current corresponding to the new local oscillator frequency is applied. This results in always tuning the C.C.I. in a single direction and therefore accurately setting the C.C.I. to desired values of inductance despite any hysteresis characteristic of the C.C.I. During the time that the C.C.I. is being set by the reference current, a muting signal is created by a monostable multivibrator which silences the speaker of the receiver via an audio gate. In this manner the receiver effectively ignores the time that the C.C.I. is being set by the reference current.

12 Claims, 3 Drawing Figures

ELECTRICALLY TUNABLE INDUCTOR AND METHOD

CROSS REFERENCE TO RELATED APPLICATIONS

The present invention is related to various aspects of the inventions described in two copending U.S. patent applications entitled "Universal Automotive Electronic Radio", Ser. No. 583,343, filed June 2, 1975, now U.S. Pat. No. 4,135,158, and "Multi-Channel Communication Device with Manual and Automatic Scanning Electronic Channel Selection", Ser. No. 711,036, filed Aug. 2, 1976, both applications assigned to the assignee of the present invention.

BACKGROUND OF THE INVENTION

The present invention generally relates to the field of electrically controllable impedance and/or reactance devices. More particularly, the present invention relates to the field of tunable radio receivers in which radio tuning is at least partially accomplished by the use of an electrically tunable inductor.

Generally, electrically tunable inductors include a control winding wound on a magnetically saturable core with a signal winding also wound on the same core. A control current is passed through the control winding in order to control the degree of magnetic saturation of the core. The inductance of the signal winding is inversely related to the degree of magnetic saturation of the core, which in turn controls the small-signal permeability of the core. Thus by altering the magnitude of the control currents passing through the control winding, the magnitude of the inductance of the signal winding is varied.

In general, radio receivers using such a controllable inductor for tuning purposes have been disclosed (see U.S. Pat. No. 2,941,173). However, C.C.I.s have not been used for tuning radio receivers which are tunable only in discrete frequency increments or require a consistent tuner reset capability. This is because C.C.I.s have a substantial hysteresis effect. In other words, for any one control current, at least two different values of inductance are possible because of the residual magnetism effect of the magnetic core of the C.C.I. Thus electronically tuning the RF stage of a radio through the use of a C.C.I. has not been previously possible in pushbutton radios or any other radio in which the tuning is accomplished in predetermined discrete steps. For these types of radios either mechanically controllable inductive tuning systems comprising coils and mechanically slidable cores or electrically controllable capacitive tuning systems using varactor diodes have been used. The mechanically tunable inductive systems are complicated, expensive and subject to mechanical wear which will eventually effect their accuracy. The capacitive varactor tuning systems are particularly inappropriate for the tuning of the antenna input stage of an automotive AM receiver (550 kHz through 1600 kHz). This is because automotive AM broadcast band antennas are generally much shorter than a quarter wavelength and therefore act as a capacitive reactance. When a subsequent tuned RF stage is tuned by a varactor over the broadcast band, it can be shown that the gain of the tunable RF stage will vary greatly as it is tuned over the band. Inductively tuning the RF stage will eliminate this undesirable gain variation. However, as previously mentioned because of the hysteresis characteristics of C.C.I.s this type of electronic tuning was not possible when the tuning was to take place in discrete frequency increments or in a controlled repeatable manner.

SUMMARY OF THE INVENTION

An object of the present invention is to provide an improved electrically controllable impedance and/or reactance and improved methods which overcome the aforementioned deficiencies.

A more particular object of the present invention is to provide an improved electrically tunable inductor in which any hysteresis characteristic of the inductor has a minimum effect, and to provide a radio receiver having such an improved electrically tunable inductor.

A further object of the present invention is to provide an improved radio receiver which is tunable in discrete frequency steps by an electrically tunable inductor, and also to provide such a radio receiver in which the tunable RF stage following the antenna is electrically inductively tunable.

In one embodiment of the present invention apparatus is provided for electrically setting an impedance and/or reactance device to a plurality of descrete desired impedance and/or reactance values during the operative state of an electronic device containing the impedance and/or reactance device. The apparatus in the operative electronic device comprises: at least one controllable impedance means for receiving electrical signals and producing corresponding impedance values in response thereto; means for generating and applying a plurality of desired electrical control signals to said controllable impedance means for producing a corresponding plurality of desired values of impedance; and means for generating and applying an electrical reference signal to said impedance means prior to the application of each of said desired control signals to said impedance means, whereby accurately setting said impedance means to desired values of impedance is accomplished despite any hysteresis characteristic of said impedance means.

More particularly, a plurality of discrete inductance values for an electronically controllable inductor means are produced by generating corresponding control currents for each of the desired inductance values, but applying a single reference current to the electrically controllable inductor means prior to applying any of these desired control currents. In this manner, the controllable inductor means (C.C.I.) is always tuned in the same direction, i.e., from the same reference current. Therefore the effect of the hysteresis characteristic of the C.C.I. is minimized and the C.C.I. can be accurately set to any inductance value. Because of this, it is now possible to generate a plurality of predetermined controlled currents for the C.C.I. which will result in producing a plurality of predetermined inductance values. An additional feature of the present invention is that a muting signal is produced which controls an audio gate that decouples the speaker of a radio receiver during the setting of the C.C.I. by the reference signal. In this manner the radio receiver effectively ignores the time that the C.C.I. is being set by the reference current.

BRIEF DESCRIPTION OF THE DRAWINGS

For a more complete understanding of the invention reference should be made to the drawings, in which.

DESCRIPTION OF THE PREFERRED EMBODIMENT

Figure 1:
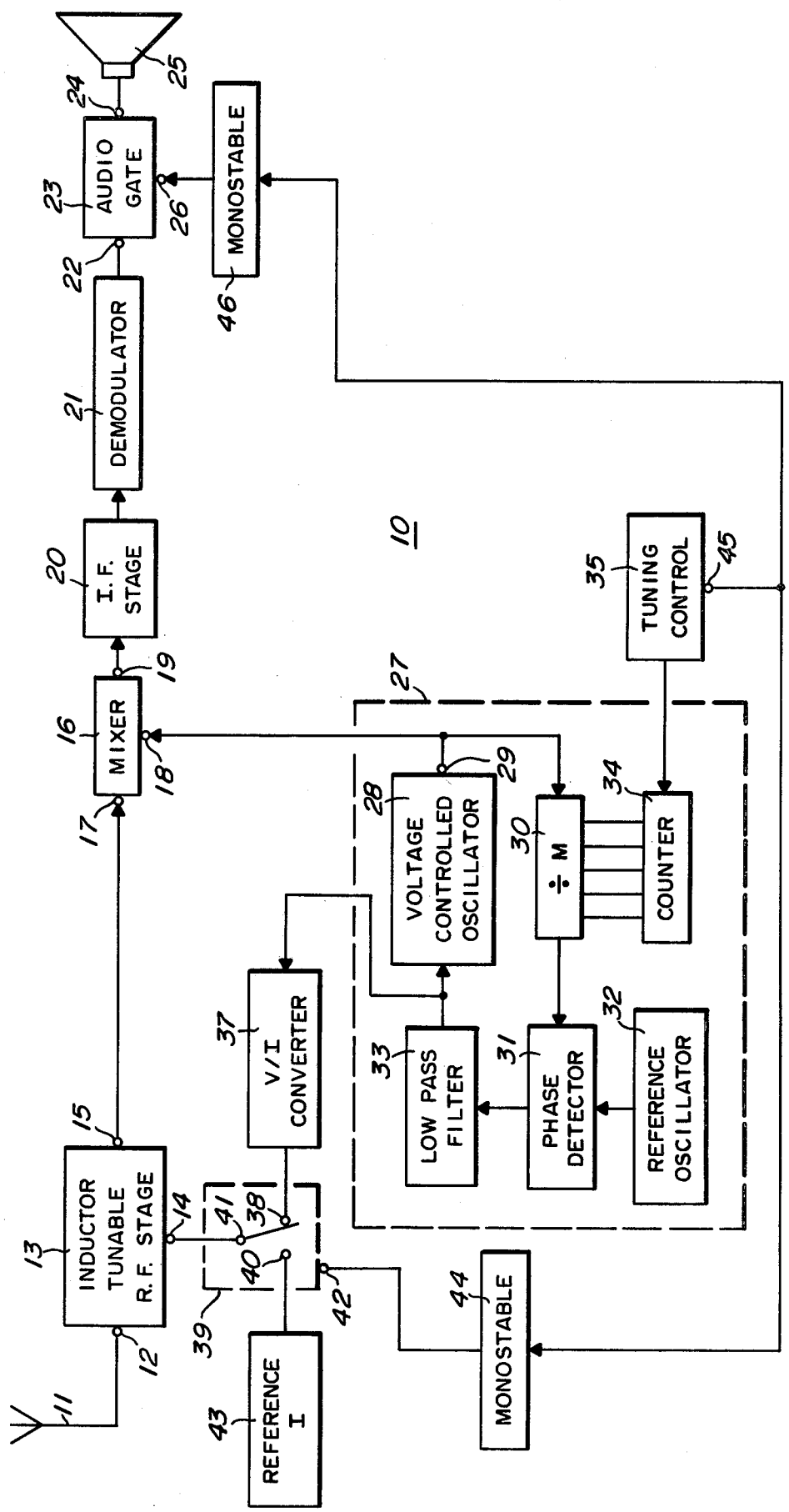
FIG. 1 is a schematic diagram of a radio receiver having an electrically, inductively tunable RF stage.

Referring to FIG. 1, a tunable radio receiver 10 is illustrated which is intended for use throughout the broadcast band of 550 kHz to 1600 kHz. The receiver 10 includes an antenna 11 that supplies an input signal to an input terminal 12 of a tunable RF stage 13 which includes an electrically tunable inductor, preferably a C.C.I., which receives control currents at a control terminal 14 of the tunable RF stage 13. The RF stage receives all of the signals from the antenna 11 and selectively passes certain of these signals to an output terminal 15. A mixer 16 has an input terminal 17 which receives the signals from the terminal 15 and mixes them with signals received at a second input terminal 18 to provide a difference frequency signal at an output terminal 19. The signals at the terminal 19 are then coupled to a highly selective IF stage 20 which amplifies these signals and supplies them to a demodulator circuit 21. The demodulator demodulates the received signals from the IF stage and couples the demodulated signals to an input terminal 22 of an audio gate 23. An output terminal 24 of the audio gate is directly coupled to a speaker 25 of the receiver 10 and the audio gate is opened and closed by signals received at a control terminal 26 of the gate 23.

The operation of the components 13, 16, 20, 21, 23 and 25 is well known to those skilled in the art. Therefore the operation of these components will not be extensively discussed. Basically, the tunable RF stage provides initial selectivity for the radio receiver 10 while the mixer 16 receives a local oscillator signal at the terminal 18 and converts the received signal to an IF signal which is processed by the IF stage 20. The demodulator 21 demodulates the amplified IF signal and the audio gate 23 selectively couples the audio demodulated signal to the speaker 25. The audio gate 23 merely represents an electrically controllable switch which provides a short circuit between the terminals 22 and 24 when no signal is applied to the control terminal 26 and provides an open circuit between the terminals 22 and 24 whenever a positive pulse is applied to the terminal 26.

The local oscillator signal received at the terminal 18 is produced by a frequency synthesizer digital phase locked loop circuit 27 (shown dashed). The phase locked loop circuit includes a voltage controlled oscillator (VCO) 28 having an output terminal 29 which is directly coupled to the terminal 18 and also to the input of a programmable frequency divider 30. The output of the frequency divider is coupled to a phase detector 31 which receives another input from a highly stable reference oscillator 32 and provides an output which is coupled to the input of the VCO 28 through a low pass filter 33. A counter 34 has a plurality of connections to the programmable frequency divider 30 and the count of the counter controls the relationship between the input and output of the programmable frequency divider 30.

The components 28 through 34 comprise the digital phase locked loop 27 and the operation and construction of each of these components is well known to those skilled in the art. A tuning control apparatus 35 is coupled to the counter 34 and controls the count of this counter which in turn controls the divide by relationship of the divider 30 which determines the frequency of the output signal of the digital phase locked loop which is supplied to the local oscillator terminal 18 of the mixer 16. Two U.S. patent applications assigned to the assignee of the present invention, Ser. No. 583,343, filed June 2, 1975 now U.S. Pat. No. 4,135,158 and Ser. No. 711,036, filed Aug. 2, 1976, illustrated various embodiments for the tuning control apparatus 35 and the digital phase locked loop 27 as well as explaining the operation of these components. Both references teach simple manual tuning switches which selectively generate control signals that selectively gate clock pulses to a counter whose count controls the output frequency of a phase locked loop that serves as the local oscillator of a radio.

Basically, the tuning control apparatus 35 controls the count of the counter 34 in accordance with the desires of the operator of the radio receiver 10. In this manner, the output frequencies of the voltage controlled oscillator 28 are varied in discrete frequency steps such that the radio receiver 10 is tuned in discrete frequency steps to whatever station the operator of the receiver desires. Tuning in discrete steps is to be contrasted with tuning in infinitely variable steps in which the local oscillator frequency may be set to an arbitrary frequency. The tuning control apparatus 35 and the digital phase lock loop 27 provide an output signal having only a predetermined plurality of discrete frequencies to the mixer 16. This results in tuning the radio receiver 10 to only the plurality of discrete frequencies which are assigned to each of the radio frequency channels in the broadcast band.

The output of the low pass filter 33 is a D.C. voltage that is proportional to output frequency of the VCO 28. This D.C. voltage is used to derive a current to control the inductance of the C.C.I. The D.C. voltage is connected to the input of a voltage-to-current converter 37 which converts the D.C. voltage to a control current signal. The converter's transfer function is designed to compensate for the offset difference between the output frequency of the VCO 28 and the tuned frequency of the RF stage 13, as well as any tuning compensation requirements of the C.C.I. itself. The converter 37 can be readily implemented by using a voltage controlled current source.

The output current of the converter 37 is coupled to an input terminal 38 of an electronic switch 39 (shown dashed) which has another input terminal 40, a wiper arm terminal 41 and a control terminal 42. The wiper arm terminal 41 is directly connected to the control terminal 14 of the inductor tunable RF stage 13. A source of fixed magnitude reference current 43 is directly connected to the terminal 40, and the control terminal 42 of the switch 39 receives output pulse signals from a monostable multivibrator 44 which receives input trigger pulses from an output terminal 45 of the tuning control apparatus 35. The terminal 45 also supplies input trigger pulses to a second monostable multivibrator 46 whose output pulses are coupled to the control terminal 26 of the audio gate 23.

The electronic switch 39 essentially functions as an electronic relay which connects the wiper arm terminal 41 to the terminal 38 in response to no voltage being applied to the terminal 42 and connects the terminal 41 directly to the terminal 40 during the existence of a positive output pulse produced by the monostable multivibrator 44. Output pulses having a predetermined duration of time are produced by the monostable 44 in response to the monostable receiving a trigger input signal from the terminal 45. These trigger input signals are produced whenever the tuning control apparatus 35 changes the count in the counter 34. Thus whenever the frequency produced by the phase locked loop 27 is altered, a trigger input signal is produced at the terminal 45. This results in both of the monostables 44 and 46 producing output pulses having predetermined durations.

Unless the monostable 44 is producing a positive output pulse, the control terminal 14 of the inductor tunable RF stage receives a control current from the converter 37 which is directly related to the frequency of the local oscillator signal received at the terminal 18 of the mixer 16. Thus normally a control current is supplied to the terminal 14 which tunes the C.C.I. therein to an inductance value so that the RF stage 13 is tuned to a frequency band corresponding to the frequency of the local oscillator signal supplied to the terminal 18.

Whenever the local oscillator frequency is changed by the tuning control apparatus 35 altering the count of the counter 34, the control terminal 14 receives a predetermined reference current supplied by the source 43 for a predetermined duration of time corresponding to the width of the output pulse of the monostable 44. In this manner, a predetermined electrical current reference signal is applied to the C.C.I. in the RF stage 13 immediately prior to the application of each current control signal produced by the converter 37 which directly corresponds to the frequency of the local oscillator signal supplied to the terminal 18. This results in accurately setting the inductance value of the C.C.I. in the RF stage 13 despite any hysteresis characteristic of the C.C.I. This can be more readily understood by referring to the FIGS. 2 and 3.

Figure 2:
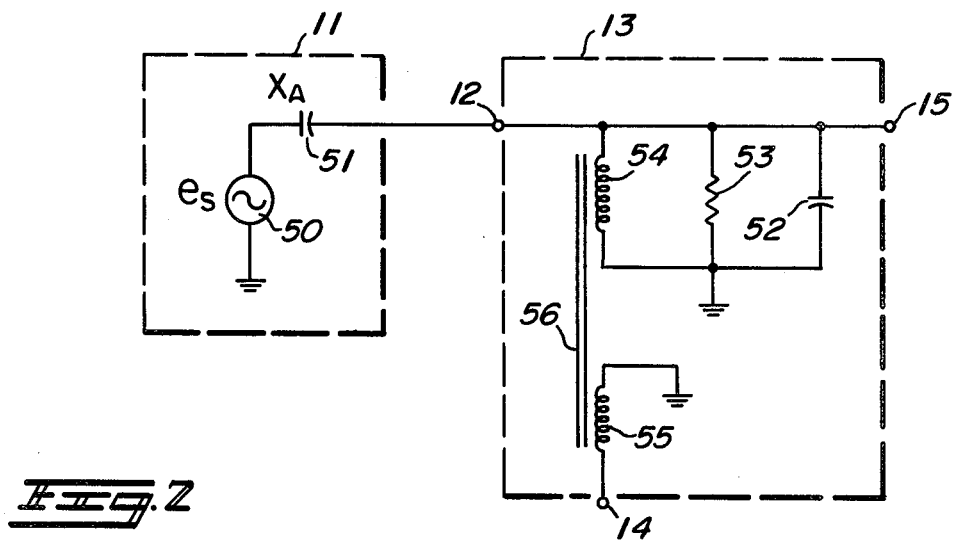
FIG. 2 is a schematic diagram illustrating an equivalent circuit for the antenna and the inductively tunable RF stage of the radio receiver shown in FIG. 1.

FIG. 2 is a schematic diagram of the equivalent circuit of the antenna 11 and the inductor tunable RF stage 13. Corresponding components in FIGS. 1 and 2 have been given identical reference numbers. The antenna 11 is shown dashed as comprising an equivalent RF signal source 50 in series with an equivalent capacitor 51 coupled between ground and the input terminal 12 of the tunable RF stage 13. The capacitor 51 represents the equivalent capacitive reactance of the broadcast band antenna 11. The antenna has a capacitive reactance since it is substantially shorter than a quarter wavelength of any of the frequencies in the broadcast band. This is typically the case for broadcast band antennas which are mounted on automobiles.

In FIG. 2, the tunable RF stage 13 is essentially shown as a parallel tuned circuit having an equivalent capacitor 52, a resistor 53 and a signal winding 54 of a C.C.I. all coupled in parallel between the terminal 12 and ground. The terminals 12 and 15 are shown directly connected to each other. The signal winding 54 of the C.C.I. is magnetically coupled to a control winding 55 through a schematically illustrated magnetic core designated by the reference number 56. One end of the control winding 55 is connected to ground and the other end of the winding 55 is directly connected to the control terminal 14 of the tunable RF stage. By applying various DC control currents to the terminal 14, the control winding 55 effectively alters the magnetic permeability of the core 56. This results in changing the inductance of the signal winding 54 and thereby changing the resonant frequency of the tuned circuit formed by the components 52 through 54. The effect of this is to alter which frequencies the RF stage 13 will pass between the terminals 12 and 15, since only frequencies at or close to the resonant frequency of the tuned circuit will be passed.

The components 54 through 56 generally comprise a DC current controlled inductor in which the current through a control winding is used to alter the inductance of an AC signal winding. While C.C.I.s have been used before to tune the RF stages of radios, their use has not been widespread because the residual magnetism of these devices has prevented accurately obtaining a fixed value of inductance by passing a known predetermined value of current through the control winding. The present invention solves this problem by minimizing the residual magnetism effects of the C.C.I. This occurs by essentially applying a fixed reference current to the control winding prior to applying the desired predetermined control current which selects a corresponding predetermined value of inductance for the signal winding. This can be more readily understoood by reference to FIG. 3.

Figure 3:
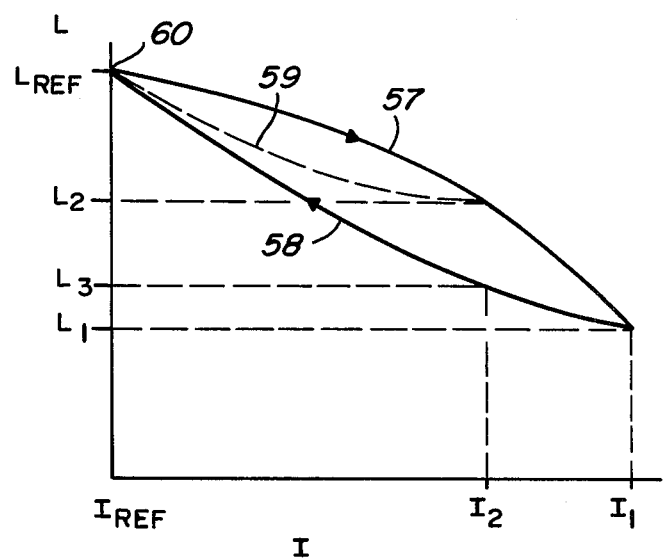
FIG. 3 is a graph illustrating the inductance vs. current characteristic of an electrically controllable inductor in the tunable RF stage illustrated in FIGS. 1 and 2.

FIG. 3 is a graph which plots the inductance L of the signal winding 54 versus the DC control current I applied to the control winding 55. With no control current applied, the inductance of the signal winding 54 is equal to $L_{ref}$ and this condition is represented by the point 60 in FIG. 3. By applying a known control current $I_1$ to the control winding 55 which previously had no control current flowing in it, the inductance of the signal winding 54 will effectively move along an arcuate path 57 to a corresponding value of inductance $L_1$. If the control current is now changed from the current $I_1$ to a smaller magnitude current $I_2$, the inductance of the signal winding 54 will change along a different arcuate path 58 to a value of inductance $L_3$. If instead of changing the control current from $I_1$ to the smaller control current $I_2$, the control current had been changed directly from a zero magnitude to the control current $I_2$, then the inductance of winding 54 would move effectively from the point 60 along the arcuate path 57 to a value of inductance $L_2$. Thus FIG. 3 illustrates that because of residual magnetism effects, the value of inductance produced by a C.C.I. will be dependent upon the direction in which the C.C.I. is tuned. Thus many different values of inductance can be obtained for any single value of control current due to the residual magnetism hysteresis effects of the C.C.I.

The present invention solves this hysteresis problem by always applying a fixed reference current to the control winding of the C.C.I. before the C.C.I. is set to any new value of inductance. In the present case, this fixed value of control current $I_{ref}$ corresponds to a zero magnitude DC control current. Thus a zero control current is initially applied to the winding 55, and then a control current $I_1$ corresponding to a desired local oscillator frequency is applied to the winding 55 to set the inductance of the signal winding 54 to a desired value $L_1$ by effectively traveling along path 57. When the local oscillator frequency is changed, initally the same reference current $I_{ref}$ is applied to the winding 55 such that the inductance will return substantially to the inductance value $L_{ref}$ along path 58. Subsequently, a control current $I_2$ corresponding to this new local oscillator frequency is applied to the winding 55. This results in again effectively traveling along the same arcuate path 57 to set the inductance of the signal winding 54 to the known predetermined value $L_2$. If the local oscillator frequency is again changed, then again the reference current $I_{ref}$ is applied to the control winding 55 resulting in returning the inductance of the signal winding to the magnitude $L_{ref}$ along an arcuate path 59 shown dashed. Subsequently, any new control current can be applied to the control winding 55 which will result in setting the inductance of the signal winding 54 to any corresponding inductance value along the single arcuate path 57. Thus the present invention has minimized the effect of the hysteresis characteristic of the C.C.I. comprising the components 54 through 56.

While FIG. 3 illustrates that for a zero magnitude DC control current applied to the winding 55 only a single value of inductance $L_{ref}$ exists for the signal winding 54 at the reference point 60 on the graph, actually the inductance value may not exactly return to the point 60 for a zero DC control current. However, this amount of error has been found to only negligibly affect the tuning accuracy of the present invention, and this error is substantially less than the tuning errors which would occur if the C.C.I. was used without resetting to a reference current prior to applying each new control current.

A more accurate system can be provided if, instead of applying just a DC reference current of zero magnitude, a reference current signal having a damped sinusoidal waveform which varied about a zero magnitude DC level were applied to the control winding 55. By applying a reference signal having this waveform to the control winding 55, a single reference point of inductance corresponding to the point 60 would always be reached whenever this reference signal was applied. Generating such a damped sinusoidal waveform for the reference current would represent no problem since this waveform could be readily implemented by providing a ringing circuit for producing the desired reference current waveform.

The monostable multivibrator 46 produces output pulses having predetermined durations in response to the same trigger pulses which trigger the monostable 44. The monostable 46 effectively disconnects the input and output terminals 22 and 24 during the duration of its output pulses. Thus essentially the audio gate 23 functions as an electronic relay which selectively passes signals in response to the control voltage at the terminal 26.

The purpose of the monostable 46 is to disconnect the speaker 25 during the time that the current reference signal is being applied to the control winding 55. In this manner the radio receiver 10 will effectively ignore the time that the reference current produced by the source 43 is applied to the C.C.I. in the tunable RF stage 13. This is desirable since the application of the reference current to the tunable RF stage may instantaneously cause the production of undesirable audio signals at the terminal 22. Thus the monostable 46 effectively squelches these undesirable signals. In order for the monostable 46 and the audio gate 23 to operate effectively to squelch these undersirable signals, the duration of the pulses produced by the monostable 46 should be at least equal to the duration of the pulses produced by the monostable 44. Thus the audio gate 23 will remain open during the entire time that the reference signal is being applied to the control winding 55 of the C.C.I. It is also desirable to have the duration of the pulses of the monostable 46 not only equal to the duration of the monostable 44 pulses, but also to the additional time required for applying the desired control current to the control winding 55 and having the inductance of the signal winding 54 effectively travel from the point 60 along the arcuate path 57 to whatever value of inductance is desired.

While the primary application of the present invention is related to the use of a C.C.I. in the tunable RF stage of a receiver, the present invention is not intended to be so limited in its scope. Obviously, the present invention can be used wherever hysteresis effects of a variable impedance and/or reactance device prevent an accurate setting of the impedance or reactance of the device in response to predetermined control signals. In addition, a C.C.I. could also be used to tune an oscillator, and the frequency of the oscillator varied in accordance with predetermined control signals while the hysteresis effects of the C.C.I. were minimized by use of the present invention.

Applying the present invention to the tunable RF stage of a broadcast band receiver results in substantial benefits. This is because inductively tuning the RF stage of a broadcast band receiver will result in producing a tunable RF stage whose output signal gain does not vary substantially over the band. This can be seen by analyzing the equivalent circuit shown in FIG. 2.

Since the antenna 11 is typically substantially shorter than a quarter wavelength, it will appear as a capacitive reactance across the entire band. Thus the impedance of the equivalent capacitor 51 will vary inversely as a function of frequency. In order for the RF circuit 13 to have a relatively constant gain output across the band, its equivalent circuit resonant impedance should also vary inversely as a function of frequency across the band. Since the components 52 through 54 form a resonant circuit tuned to the frequency of the radio receiver 10, the equivalent impedance of the circuit 13 at this resonant frequency is equal to the effective value of the equivalent resistor 53. The Q of the tuned circuit is approximately equal to the magnitude of the equivalent resistor 53 divided by either the inductive reactance of the winding 54 or the capacitive reactance of the capacitor 52. For an inductively tuned circuit such as the one shown in FIG. 2, the magnitude of the capacitor is constant and therefore the capacitive reactance varies inversely as a function of frequency. Since the Q of the resonant circuit remains approximately constant over the broadcast band, this means that the magnitude of the equivalent resistor 53 will also have to vary inversely as a function of frequency over the broadcast band. Thus for inductively tuned RF stages, the gain of the stage remains approximately constant over the entire band. If RF stages are capacitively tuned, e.g. by the use of a varactor diode, then a 9 to 1 variation in the gain of the RF stage is experienced over the 3 to 1 variation in frequency which occurs over the broadcast band (550 kHz to 1600 kHz). Thus the present invention provides the advantage of having an accurately controllable inductively tuned RF stage having a substantially constant signal gain over the broadcast band.

While I have shown and described specific embodiments of this invention, further modifications and improvements will occur to those skilled in the art. All such modifications which retain the basic underlying principles disclosed and claimed herein are within the scope of this invention.

I claim:

1. A receiver comprising:

antenna means for receiving signals;

tuning means coupled to said antenna means and operative during the operation of said receiver for selecting some of the received signals for further processing; and speaker means coupled to said tuning means for producing audible signals in response to the signal selected by said tuning means;

said tuning means including a tunable RF stage coupled to said antenna means and providing a frequency selective output, said RF stage including at least one electrically controllable inductor means having a control terminal for receiving electrical control signals and producing corresponding inductance values in response thereto for controlling the selection of said RF stage;

said tuning means also including both a tunable frequency synthesizer, which produces a local oscillator tuning signal and a mixer stage which receives the local oscillator signal and receives the output of the RF stage and translates one frequency in the output of the RF stage to a predetermined IF frequency;

means for generating at a first terminal a plurality of desired electrical control signals to be applied to said controllable inductor means for producing a corresponding plurality of desired values of inductance, said plurality of desired electrical control signals being determined by said frequency synthesizer;

means for generating at a second terminal an electrical reference signal to be applied to said inductor means prior to the application of each of said desired control signals to said inductor means, said reference signal, when applied to said inductor means, causing a reference inductance value; and means for controlling said control signal generating means and said reference signal generating means by producing a trigger input signal whenever a change in the frequency of the local oscillator tuning signal is to be implemented, said trigger input signal resulting in automatically applying said reference signal to said inductor means control terminal and then applying any desired one of said control signals to said inductor means control terminal by coupling said control terminal initially to said second terminal and then to said first terminal, whereby accurately tuning said receiver by setting said inductor means to desired values of inductance is accomplished despite any hysteresis characteristic of said inductor means.

2. A receiver according to claim 1 wherein said plurality of desired electrically control signals comprise a plurality of control currents which are applied to said controllable inductor means, and wherein said electrical reference signal comprises an electrical reference current which is applied to said inductor means.

3. A receiver according to claim 2 wherein said controllable inductor means comprises a current controlled inductor having a magnetic core and in which the control currents and the reference current are used to control the magnetic permeability of the core by exciting a control winding on said core and said desired values of inductance are provided by a signal winding on said core.

4. A receiver according to claim 3 wherein said reference current has substantially zero magnitude.

5. A receiver according to claim 3 wherein said reference current has a damped sinusoidal waveform varying about a predetermined DC level.

6. A receiver according to claim 5 wherein said DC level is approximately zero.

7. A receiver according to claim 3 wherein said means for generating said plurality of desired control signals only generates said electrical control signals in discrete tuning steps, wherein said frequency synthesizer comprises a phase locked loop which determines said electrical control signals and said phase locked loop of said synthesizer is a digital phase locked loop.

8. A receiver according to claim 7 wherein said digital phase locked loop includes a low pass filter receiving a signal from a phase detector and coupling an output signal to a voltage controlled oscillator which supplies a signal to a programmable frequency divider that supplies an input signal to said phase detector.

9. A receiver according to claim 8 wherein said low pass filter output signal is coupled to a converter stage which provides said plurality of electrical current control signals to said first terminal in response to said low pass filter output signal.

10. A receiver according to claim 3 which includes at least one circuitry stage which is coupled between said tuning means and said speaker means, and additional means for generating and applying, in response to said trigger input signal, a muting signal to said circuitry stage during at least the time that said electrical reference signal is applied to said controllable inductor means, whereby said receiver effectively ignores the time that said inductor means is being set to said reference inductance value.

11. A receiver according to claim 1 which includes at least one circuitry stage which is coupled between said tuning means and said speaker means, and additional means for generating and applying, in response to said trigger input signal, a muting signal to said circuitry stage during at least the time that said electrical reference signal is applied to said controllable inductor means, whereby said receiver effectively ignores the time that said inductor means is being set to said reference inductance value.

12. A receiver according to claim 11 wherein said additional means for generating said muting signal comprises a first monostable multivibrator, and wherein said means for applying said electrical reference signal comprises a second monostable multivibrator, the output pulse duration of said first monostable multivibrator being at least equal to the output pulse duration of said second monostable multivibrator.

* * * * *